US005665172A

United States Patent [19]

Oshima et al.

[11] Patent Number: 5,665,172
[45] Date of Patent: Sep. 9, 1997

[54] METHOD FOR WASHING AN ARTICLE WITH COMPOSITION HAVING A BROMINATED HYDROCARBON AND STABILIZER

[75] Inventors: Katsuhide Oshima, Tokyo; Shigemi Tanaka, Chiba, both of Japan

[73] Assignee: Dipsol Chemicals Co., Ltd., Tokyo, Japan

[21] Appl. No.: 531,004

[22] Filed: Sep. 20, 1995

Related U.S. Application Data

[62] Division of Ser. No. 181,102, Jan. 13, 1994, Pat. No. 5,492,645.

[30] Foreign Application Priority Data

Jan. 25, 1993 [JP] Japan ............................ 5-10147

[51] Int. Cl.$^6$ ........................................... B08B 3/08
[52] U.S. Cl. ........................................... 134/40; 134/2
[58] Field of Search ................... 134/40, 2; 252/170, 252/171, 172, 364, 544, 174.25; 510/175, 273, 264, 365, 412, 255, 256, 461

[56] References Cited

U.S. PATENT DOCUMENTS

| | | |
|---|---|---|
| 2,371,645 | 3/1945 | Aitchison et al. . |
| 3,730,904 | 5/1973 | Clementson et al. . |
| 4,056,403 | 11/1977 | Cramer et al. ................ 134/40 X |
| 4,107,077 | 8/1978 | Sullivan, Jr. et al. . |
| 4,189,397 | 2/1980 | Allen . |
| 4,652,389 | 3/1987 | Moll . |
| 5,102,573 | 4/1992 | Han et al. . |
| 5,190,678 | 3/1993 | Swartz et al. . |
| 5,320,683 | 6/1994 | Samejima et al. . |
| 5,492,645 | 2/1996 | Oshima et al. ................ 252/171 |

FOREIGN PATENT DOCUMENTS

| | | |
|---|---|---|
| 2135296 | 5/1990 | Japan . |
| 2204448 | 8/1990 | Japan . |
| 2204449 | 8/1990 | Japan . |
| 2209819 | 8/1990 | Japan . |
| 2204455 | 8/1990 | Japan . |
| 2215736 | 8/1990 | Japan . |
| 3-173835 | 7/1991 | Japan . |
| 1276783 | 6/1972 | United Kingdom . |
| 90/08814 | 8/1990 | WIPO . |

OTHER PUBLICATIONS

1986–87 Alfa Catalog, Research Chemicals and Materials, Morton Thickel, Inc., 1986, pp. 89–100.

Kirk–Othmer, *Encyclopedia of Chemical Technology*, 3rd ed., vol. 4, John Wiley & Sons, 1978, pp. 256, 257, 262.

*Primary Examiner*—Douglas J. McGinty
*Attorney, Agent, or Firm*—Oblon, Spivak, McClelland, Maier & Neustadt, P.C.

[57] ABSTRACT

A deterring solvent essentially consists of (A) a brominated hydrocarbon of the formula: $C_nH_{2n+1}Br$ wherein n represents a number of 3 or above and/or a brominated hydrocarbon of the formula: $C_mH_{2m-1}Br$ wherein m represents a number of 2 or above. A deterging solvent composition comprises the above-described solvent (A) and a stabilizer selected from the group consisting of nitroalkanes, ethers, epoxides and amines. These solvent and solvent composition have an excellent deterging effect and usable as a substitute for the flon and chlorine solvents. Furthermore, the deterging solvent composition has a high stability.

19 Claims, No Drawings

METHOD FOR WASHING AN ARTICLE WITH COMPOSITION HAVING A BROMINATED HYDROCARBON AND STABILIZER

This is a Division of application Ser. No. 08/181,102 filed on Jan. 13, 1994, now U.S. Pat. No. 5,492,645.

BACKGROUND OF THE INVENTION

The present invention relates to a deterging solvent composition to be used as a substitute for chlorofluorocarbon (hereinafter referred to as "flon") solvents and chlorine solvents, and a method for washing an article with the same.

The flon and chlorine solvents have been widely used heretofore. Various techniques of stabilizing and using flon and chlorine solvents were developed. For example, Japanese Patent Unexamined Published Application (hereinafter referred to as "J.P. KOKAI") No. Hei 3-173835 discloses a stabilizing method wherein a stabilizer selected from the group consisting of nitro compounds, phenols, amines, ethers, amylenes, esters, organic phosphites, epoxides, furans, alcohols, ketones and triazoles is added to an azeotropic mixture comprising trichlorodifluoroethane and a hydrocarbon, alcohol, ketone, ether, ester or the like.

However, the use of the flon and chlorine solvents is limited in recent years because they cause environmental problems. Under these circumstances, the development of an excellent deterging solvents usable in place of the above-described solvents and a technique of stabilizing them has been eagerly demanded.

On the other hand, brominated hydrocarbons have not been used as solvents for degreasing and deterging metal parts and plastics, since they are inferior in the chemical stability and incombustibility to the flons and chlorinated hydrocarbons.

SUMMARY OF THE INVENTION

Therefore, an object of the present invention is to provide a new deterging solvent composition having an excellent deterging effect and usable as a substitute for the flon and chlorine solvents.

Another object of the present invention is to provide a deterging solvent composition having a high stability.

Another object of the present invention is to provide a method for washing an article with the above-described solvent composition.

These and other objects of the present invention will be apparent from the following description and examples.

After intensive investigations on brominated hydrocarbons, the inventors found that specific-brominated hydrocarbons are flame-retardant and have a high power of dissolving oils and excellent degreasing and deterging properties. However, the inventors also found defects with brominated hydrocarbons the reactivity of these solvents with metals, particularly aluminum and its alloys is extremely high. The problem is that this reaction occurs even at ambient temperature, and particularly when the temperature is elevated for the deterging with a vapor, the reaction becomes vigorous. Namely, the solvent reacts with aluminum in a short time of 10 to 20 min to form a dark brown tar or carbide and also to seriously corrode aluminum and finally to completely dissolve aluminum. After further investigations made for the purpose of finding a stabilizer which can be stably usable for the vapor deterging for a long period of time, the inventors have found that the reactivity of the detergent with the metal can be remarkably reduced by adding a specified stabilizer. The present invention has been completed on the basis of this finding.

In the first aspect of the present invention, there is provided a deterging solvent which essentially consists of (A) a brominated hydrocarbon of the formula: $C_nH_{2n+1}Br$ wherein n represents a number of 3 or above and/or a brominated hydrocarbon of the formula: $C_mH_{2m-1}Br$ wherein m represents a number of 2 or above.

In the second aspect of the present invention, there is provided a stable deterging solvent composition which comprises the above-described solvent (A) and a stabilizer selected from the group consisting of nitroalkanes, ethers, epoxides and amines.

In the third aspect of the present invention, there is provided a stable deterging solvent composition which comprises the above-described solvent (A), a solvent selected from the group consisting of (B) nitroalkanes, ethers, epoxides and (C) amines.

In the fourth aspect of the present invention, there is provided a method for washing an article with the solvent or solvent compositions mentioned above.

DESCRIPTION OF THE PREFERRED EMBODIMENTS

Examples of the brominated hydrocarbons represented by the formula: $C_nH_{2n+1}Br$ or $C_mH_{2m-1}Br$ usable in the present invention include n-propyl bromide, iso-propyl bromide, n-butyl bromide, isobutyl bromide, sec-butyl bromide, n-amyl bromide, isoamyl bromide, n-hexyl bromide, n-heptyl bromide, n-octyl bromide, 2-ethylhexyl bromide, n-nonyl bromide, n-decyl bromide, allyl bromide, butylene bromide and hexylene bromide. They are usable either singly or in the form of a mixture of two or more of them.

In the formulae, n in the above formula represents a number of B or above, preferably 3 to 8, still preferably 3 to 6, whereas m in the above formula represents a number of 2 or above, preferably 2 to 9, still preferably 3 to 7. Among these, n-propyl bromide and iso-propyl bromide are the most preferable.

The nitroalkanes usable in the present invention include nitromethane, nitroethane, 1-nitropropane, 2-nitropropane and nitrobenzene. They are usable either singly or in the form of a mixture of two or more of them.

The ethers include 1,2-dimethoxyethane, 1,4-dioxane, diethyl ether, diisopropyl ether, dibutyl ether, trioxane, alkyl cellosolves in which the alkyl group has 1 to 10 carbon atoms such as methyl cellosolve, ethyl cellosolve and iso-propyl cellosolve, acetal, acetone dimethylacetal, γ-butyrolactone, methyl t-butyl ether, tetrahydrofuran and N-methylpyrrole. They are usable either singly or in the form of a mixture of two or more of them.

The epoxides include epichlorohydrin, propylene oxide, butylene oxide, cyclohexene oxide, glycidyl methyl ether, glycidyl methacrylate, pentene oxide, cyclopentene oxide and cyclohexene oxide. They are usable either singly or in the form of a mixture of two or more of them.

The amines include hexylamine, octylamine, 2-ethylhexylamine, dodecylamine, ethylbutylamine, hexylmethylamine, butyloctylamine, dibutylamine, octadecylmethylamine, triethylamine, tributylamine, diethyloctylamine, tetradecyldimethylamine, diisobutylamine, diisopropylamine, pentylamine, N-methylmorpholine, isopropylamine, cyclohexylamine, butylamine, isobutylamine, dipropylamine, 2,2,2,6- tetramethylpiperidine, N,N-diallyl-p-phenylenediamine, diallylamine, aniline, ethylenediamine, propylenediamine, diethylenetriamine, tetraethylenepentamine, benzylamine, dibenzylamine, diphenylamine and diethylhydroxyamine. They are usable either singly or in the form of a mixture of two or more of them.

The quantity or relative amount of the stabilizer necessitated for the stabilization of the above-described brominated hydrocarbons varies in a wide range depending on the kind of the oil adhering to the material to be deterged and also on the deterging conditions such as deterging method. It is preferably in the range of 0.1 to 15% by weight, more preferably in the range of 0.5 to 10% by weight, based on the total weight of the brominated hydrocarbons. When it is below 0.1%, the stabilizing effect is insufficient and, on the contrary, an amound exceeding 15% is economically disadvantageous.

Although the stabilizer exhibits its effect even when it is used solely, a combination of two or more stabilizers is also usable. In the latter case, the total amount of the stabilizers is preferably in the range of 0.1 to 15%.

The composition preferably contains at least one compound (B) selected from the group consisting of nitromethane, nitroethane and nitropropane and also at least one compound (C) selected from the group consisting of alkyl cellosolves and dioxane. In this connection, n-propyl bromide and iso-propyl bromide are preferable as solvent (A).

The alkyl cellosolves (C) are those in which the alkyl group has 1 to 10 carbon atoms, preferably 1 to 3 carbon atoms, such as methyl cellosolve, ethyl cellosolve and isopropyl cellosolve. They are usable either singly or in the form of a mixture of two or more of them.

Altough amounts of the component (B) and (C) ralative to the amount of component (A) are not particularly limited, it is preferred that the component (A) contains 0.5 to 15%, particularly 1 to 5%, of the component (B) and that the component (A) contains 0.01 to 10%, particularly 0.05 to 3%, of the component (C). pH of the deterging solvent composition is preferably controlled at 6 to 8 with an amine.

The deterging solvent composition of the present invention may contain, in addition to the above-described stabilizer, an assistant stabilizer selected from the group consisting of those usually used as the stabilizers for chlorinated hydrocarbons such as phenols, e.g. phenol and o-cresol; aminoalcohols, e.g. monoethanolamine, diethanolamine and triethanolamine; acetylene alcohols, e.g. methylbutynol, methylpentynol and propargyl alcohol; and triazoles, e.g. benzotriazole, (2-hydroxyphenyl) benzotriazole and chlorobenzotriazole.

The deterging solvent and deterging solvent composition of the present invention containing the component (A) has excellent degreasing and deterging properties and is usable as a substitute for the flon and chlorine solvents. By incorporating the specified stabilizer into the composition, metals can be effectively and stably degreased and deterged with the composition for a long period of time without being corroded. In particular, by incorporating the components (B) and (C) into the composition, metals can be effectively and stably degreased and deterged with the composition for a long period of time without being corroded.

The deterging solvent composition is very suitable for deterging processed metal products and electronic parts. For example, an article or substrate made from metal or plastics can be washed with the deterging solvent or deterging solvent composition, for example, in order to remove grease or oil from the article or substrate. In this connection, such an article or substrate can be immersed in the deterging solvent or deterging solvent composition while heated.

The following Examples and Comparative Examples will further illustrate the present invention.

EXAMPLE 1

Deterging solvent compositions given in Table 1 were prepared. Aluminum pieces (JIS-H-4000, A 1100P) were arranged in the liquid phase and gas phase of the composition, and the corrosion of the metal pieces was observed after 48 h according to JIS-K 1600. The results were evaluated according to the following criteria:
Criteria of corrosion:
  ○: no change
  x: corroded.

The results are given in Table 1 together with the results of Comparative Examples. In the Table, nPB represents n-propyl bromide (1-Bromo propane), IPB represents iso-propyl bromide (2-Bromo propane), and the amounts of them are given in terms of the weight ratio in the parentheses.

The degreasing/deterging power was determined by a method described below:
Degreasing/deterging power test:

A press oil (trade name: Nippon Kosaku-yu #620) was applied to previously cleaned SPCC mild steel plates (50× 100×0.3 mm) and the plates were left to stand in a room for 3 days to obtain the test pieces (amount of oil remaining on the pieces: 200 to 300 mg/dm$^2$).

The test pieces were immersed in a sample solution at room temperature for 2 min and then dried. The amount of the remaining oil was determined by a gravimetric method.

When the amount of the remaining oil was 2 mg/dm$^2$ or below, the degreasing/deterging power was evaluated to be good, the amount 2 mg/dm$^2$ being equal to that of trichloroethane.

x: The amount of remaining oil was above 2 mg/dm$^2$.
○: The amount of remaining oil was 2 mg/dm$^2$ or below.

TABLE 1

| No. | Deterging solvent composition | Corrosiin | D.D. power |
|---|---|---|---|
| 1 | nPB (99.5)/nitromethane (0.5) | ○ | ○ |
| 2 | IPB (99)/nitromethane (1) | ○ | ○ |
| 3 | nPB (95)/1,2-dimethoxyethane (5) | ○ | ○ |
| 4 | IPB (97)/epichlorohydrin (3) | ○ | ○ |
| 5 | nPB (95)/diisopropylamine (5) | ○ | ○ |
| 6 | IPB (97)/nitromethane (2)/phenol (1) | ○ | ○ |
| 7 | nPB (97)/nitromethane (2)/triethanolamine (1) | ○ | ○ |
| 8 | IPB (97)/nitromethane (2)/methylbutynol (1) | ○ | ○ |
| 9 | IPB (97)/nitromethane (2)/benzotriazole (1) | ○ | ○ |
| 10 | nPB (97)/nitromethane (2)/1,2-dimethoxyethane (1) | ○ | ○ |
| 11 | IPB (97)/nitromethane (2)/diisopropylamine (1) | ○ | ○ |
| 12 | nPB (100) | X | ○ |
| 13 | IPB (100) | X | ○ |

Note:
D.D. power means degreasing/deterging power (as the same in the below)

EXAMPLE 2

The effect on the aluminum pieces was examined by varying the relative amounts of nitroethane and methyl cellosolve added to n-propyl bromide (1-Bromo propane) as given in Table 2 by methods which will be described below. pH of the deterging solvent composition comprising n-propyl bromide (1-Bromo propane), nitroethane and methyl cellosolve was previously adjusted to 7.5 with diisopropylamine.

Evaluation method (1):

The corrosion of the metal pieces was observed in the same manner as that of Example 1.

Evaluation method (2):

The deterging solvent composition was prepared and fed into a flask provided with a reflux condenser. After reflux in a hot water bath at 70° to 80° C. for 2 h, the aluminum pieces were scratched with a sharp stainless steel knife, and the state of corrosion of the surface of each aluminum piece was observed. The results were evaluated according to the following criteria:

○: no change.
x: corrosion.

TABLE 2

| Nitroethane | Methyl cellosolve | Evaluation method (1) | Evaluation method (2) |
|---|---|---|---|
| 0.5% | — | ○ | X |
| 3% | — | ○ | X |
| — | 3% | X | X |
| — | 4% | X | X |
| 0.5% | 2% | ○ | ○ |
| 2% | 1% | ○ | ○ |

EXAMPLE 3

The effect on the aluminum pieces was examined by varying the relative amounts of nitromethane and methyl cellosolve added to isopropyl bromide (2-Bromo propane) as given in Table 3 in the same manner as that of Example 2. The pH of the deterging solvent composition comprising isopropyl bromide (2-Bromo propane), nitromethane and methyl cellosolve was previously adjusted to 6.5 with diisopropylamine.

TABLE 3

| Nitromethane | Methyl cellosolve | Evaluation method (1) | Evaluation method (2) |
|---|---|---|---|
| 3% | — | ○ | X |
| — | 3% | X | X |
| 0.5% | 2% | ○ | ○ |
| 2% | 1% | ○ | ○ |

EXAMPLE 4

The effect on the aluminum pieces was examined by varying the relative amounts of nitroethane and 1,4-dioxane added to n-propyl bromide (1-Bromo propane) as given in Table a in the same manner as that of Example 2. pH of the deterging solvent composition comprising n-propyl bromide (1-Bromo propane), nitroethane and 1,4-dioxane was previously adjusted to 6.5 with diisopropylamine.

TABLE 4

| Nitroethane | 1,4-Dioxane | Evaluation method (1) | Evaluation method (2) |
|---|---|---|---|
| 3% | — | ○ | X |
| — | 3% | X | X |
| 2% | 1% | ○ | ○ |

EXAMPLE 5

The deterging solvent compositions given in Table 5 were prepared, and the corrosion of these compositions and degreasing and deterging powers of them were examined in the same manner as that of Example 1. The results are given in Table 5.

TABLE 5

| No. | Deterging solvent composition | Corrosion | D.D. power |
|---|---|---|---|
| 1 | n-Butyl bromide (99.5)/nitromethane (0.5) | ○ | ○ |
| 2 | Isobutyl bromide (99)/nitromethane (1) | ○ | ○ |
| 3 | n-Amyl bromide (95)/1,2-dimethoxyethane (5) | ○ | ○ |
| 4 | n-Hexyl bromide (97)/epichlorohydrin (3) | ○ | ○ |
| 5 | n-Heptyl bromide (95)/diisopropylamine (5) | ○ | ○ |
| 6 | n-Butyl bromide (97)/nitromethane (2)/phenol (1) | ○ | ○ |
| 7 | n-Butyl bromide (97)/nitromethane (2)/triethanolamine (1) | ○ | ○ |
| 8 | n-Butyl bromide (97)/nitromethane (2)/methylbutynol (1) | ○ | ○ |
| 9 | n-Butyl bromide (97)/nitromethane (2)/benzotriazole (1) | ○ | ○ |
| 10 | n-Butyl bromide (97)/nitromethane (2)/1,2-dimethoxyethane (1) | ○ | ○ |
| 11 | n-Butyl bromide (97)/nitromethane (2)/diisopropylamine (1) | ○ | ○ |
| 12 | Allyl bromide (99)/nitromethane (1) | ○ | ○ |
| 13 | n-Butyl bromide (100) | X | ○ |
| 14 | Isobutyl bromide (100) | X | ○ |

In the Table, n-Butyl bromide is 1-Bromo butane, Isobutyl bromide is 1-Bromo-2-methyl propane, n-Amyl bromide is 1-Bromo pentane, n-Hexyl bromide is 1-Bromo hexane, n-Heptyl bromide is 1-Bromo heptane and Allyl bromide is $CH_2=CHCH_2Br$.

What is claimed:

1. A method of cleaning oil or grease from an article comprising the steps of contacting said article with a non-chlorofluorocarbon deterging solvent, wherein said non-chlorofluorocarbon deterging solvent consists essentially of:

(A) a brominated hydrocarbon of a formula selected from the group consisting of $C_nH_{2n+1}Br$ and $C_mH_{2m-1}Br$, wherein n represents a number of 3 or above, and m represents a number of 2 or above, and (B) a stabilizer selected from the group consisting of:
   (i) a nitroalkane,
   (ii) an epoxide,
   (iii) an amine, and
   (iv) an ether selected from the group consisting of 1,2-dimethoxyethane, 1,4-dioxane, diethyl ether, diisopropyl ether, dibutyl ether, trioxane, acetal, acetone dimethylacetal, γ-butyrolactone, methyl t-butyl ether, tetrahydrofuran, N-methylpyrrole and ethylene glycol monoalkyl ether; and removing said oil or grease from said article.

2. The method of claim 1 wherein n in the formula is 3 to 8 and m in the formula is 2 to 9.

3. The method of claim 1 wherein the deterging solvent consists essentially of n-propyl bromide and/or isopropyl bromide and aid stabilizer.

4. The method of claim 1 wherein the article is made from metal or plastics.

5. The method of claim 4 wherein the article is immersed in the deterging solvent to remove grease or oil from the article.

6. The method of claim 1 wherein the deterging solvent consists essentially of 0.1 to 15 wt % of the stabilizer and a balance of component (A).

7. The method of claim 1 wherein the stabilizer is a combination of one selected from the group consisting of nitroalkanes, ethers and epoxides, with an amine.

8. The method of claim 3, wherein said deterging solvent consists essentially of 1–5% of said stabilizer.

9. The method of claim 1, wherein said deterging solvent further consists essentially of an assistant stabilizer selected from the group consisting of phenols, aminoalcohols, acetylene alcohols and triazoles.

10. A method, comprising immersing an article in a non-chlorofluorocarbon deterging solvent to remove grease or oil therefrom, wherein said article comprises metal or plastic and has said grease or oil attached, and said non-chlorofluorocarbon deterging solvent consists essentially of:

(A) a brominated hydrocarbon of a formula selected from a group consisting of $C_nH_{2n+1}Br$ and $C_mH_{2m-1}Br$, wherein n represents a number of 3 or above, and m represents a number of 2 or above, and (B) a stabilizer selected from the group consisting of:
 (i) a nitroalkane,
 (ii) an epoxide,
 (iii) an amine, and
 (iv) an ether selected from the group consisting of 1,2-dimethoxyethane, 1,4-dioxane, diethyl ether, diisopropyl ether, dibutyl ether, trioxane, acetal, acetone dimethylacetal, γ-butyrolactone, methyl t-butyl ether, tetrahydrofuran, N-methylpyrrole and ethylene glycol monoalkyl ether.

11. The method of claim 10, wherein n in the formula is 3 to 8 and m in the formula is 2 to 9.

12. The method of claim 10, wherein the deterging solvent consists essentially of n-propyl bromide and/or isopropyl bromide.

13. The method of claim 10, wherein the stabilizer is a combination of one selected from the group consisting of nitroalkanes, ethers and epoxides, with an amine.

14. The method of claim 12, wherein said deterging solvent consists essentially of 1–5% of said stabilizer.

15. The method of claim 10, wherein said deterging solvent further consists essentially of an assistant stabilizer selected from the group consisting of phenols, aminoalcohols, acetylene alcohols and triazoles.

16. A method, comprising washing an article with a deterging solvent, wherein said deterging solvent comprises:

(A) a brominated hydrocarbon selected from the group consisting of n-propyl bromide and iso-propyl bromide, and (B) a nitroalkane selected from a group consisting of nitromethane, nitroethane and nitropropane, and (C) a compound selected from the group consisting of ethylene glycol monoalkyl ethers.

17. The method of claim 16, wherein the article is made from metal or plastics, and grease or oil is attached to the article.

18. The method of claim 16, wherein said compound is selected from ethylene glycol monoalkyl ethers having 1 to 3 carbon atoms.

19. The method of claim 10, wherein the deterging solvent consists essentially of 0.1 to 15 wt % of the stabilizer and a balance of component (A).

* * * * *